(12) United States Patent
Tyagi et al.

(10) Patent No.: US 6,297,104 B1
(45) Date of Patent: *Oct. 2, 2001

(54) METHODS TO PRODUCE ASYMMETRIC MOSFET DEVICES

(75) Inventors: Sunit Tyagi; Shahriar S. Ahmed, both of Portland, OR (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/496,833

(22) Filed: Feb. 2, 2000

Related U.S. Application Data

(62) Division of application No. 09/304,601, filed on May 3, 1999.

(51) Int. Cl.⁷ .................................................. H01L 21/336
(52) U.S. Cl. ........................ 438/286; 438/302; 438/303; 438/305; 438/307; 438/525
(58) Field of Search ..................................... 438/179, 286, 438/301, 302–303, 305, 307, 525

(56) References Cited

U.S. PATENT DOCUMENTS

| | | | |
|---|---|---|---|
| 5,759,901 | * | 6/1998 | Loh et al. ............................ 438/305 |
| 5,831,306 | * | 11/1998 | Gardner et al. ....................... 257/344 |
| 5,877,050 | * | 3/1999 | Gardner et al. ....................... 438/231 |
| 5,960,291 | * | 9/1999 | Krivokapic ............................ 438/286 |
| 5,970,347 | * | 10/1999 | Gardner et al. ....................... 438/286 |
| 5,998,267 | * | 12/1999 | Bergemont et al. ................... 438/270 |
| 6,063,673 | * | 5/2000 | Kao et al. ............................. 438/286 |

\* cited by examiner

*Primary Examiner*—Long Pham
(74) *Attorney, Agent, or Firm*—George Chen

(57) ABSTRACT

Metal Oxide Semiconductor Field Effect Transistors (MOSFET) are disclosed. One MOSFET includes, a substrate having a well of a first conductivity type. The MOSFET also includes source and drain regions, of a second conductivity type, formed in the well arranged apart from each other. Moreover, the MOSFET includes a first region, of a second conductivity type, formed in the well near the drain region. The first region has a low doping. Furthermore, the MOSFET includes a second region of a second conductivity type, formed near the source region. The second region has a doping substantially higher than the doping of the first region. A second MOSFET includes a substrate having a well of a first conductivity type and source and drain regions, of a second conductivity type, formed in the well apart from each other. Moreover, the MOSFET includes a drain extension region of the second conductivity type, formed in the well near the drain region. Furthermore, the MOSFET includes a source extension region, of the second conductivity type, formed in the well near the source region. The source extension region is doped more heavily than the drain extension region. The source extension region extends deeper in the well than the drain extension region.

18 Claims, 5 Drawing Sheets

METHODS TO PRODUCE ASYMMETRIC MOSFET DEVICES

This application is a divisional of Ser. No. 09/304,601 filed May 3, 1999.

BACKGROUND OF THE INVENTION (1) Field of the Invention

The present invention relates to fabrication of semiconductor devices. More specifically, the present invention relates to fabrication of Metal Oxide Semiconductor Field Effect Transistors (MOSFET).

(2) Background Information

In MOSFETs with shorter channels there are effects, such as the short-channel effect, that cause significant deviations from the expected behavior of MOSFETs with long-channel. Short-channel effects become a dominant part of MOSFETs' behavior when the channel's length decreases below 2 micrometers. For example, it is known that when the channel's length of a MOSFET is on the order of a submicron or less, the short-channel effect influences the threshold voltage towards 0. As a result, the short-channel effect causes an increase in the leakage current when the transistor is in the cutoff condition.

Currently, the well doping profile with respect to the source and the drain of a MOSFET is symmetric, i.e. the dopings of the source and drain are substantially equal. In ultra large scale integrated (USLI) devices scaling regime, there is an intrinsic trade-off between the saturated drive current and the off-state current (leakage current) that depends on diffusion. To reduce the off-state current, higher well/channel doping is needed. This high doping increases the channel's resistance of the MOSFET causing reduction of the saturated drive current. There is a problem with the reduction of the off-state current when such reduction is at the expense of the saturated drive current.

SUMMARY OF THE INVENTION

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION OF THE INVENTION

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the present invention.

One embodiment of the present invention includes an asymmetric-well Metal Oxide Semiconductor Field Effect Transistor (MOSFET) device and a method for fabricating this device. The asymmetric well MOSFET device has an improved ON/OFF current ratio as the source-side region has a doping substantially higher than a doping of the drain-side region and the drain-side region typically is lightly doped. The mechanisms for generating current for OFF and ON states in a MOSFET are different. It has been found that the OFF state current of a MOSFET device results from a diffusion mechanism and is set by the well doping at the source-side of the channel. As the diffusion current depends on availability of minority carriers at the source-side of the channel, higher doping of the well, close to the source side causes a reduction in the OFF state current. The higher doping at the source-side of the well increases the potential barrier for minority carriers reducing the number of minority carriers that may diffuse at the source side. This results in a reduction of the OFF-state current. At the drain side, minority carriers are swept out due to the reverse bias junction at the drain side, similar to the collection of minority carriers at the collector side of a bipolar transistor. The diffusion current is negligibly or not at all influenced by the availability of minority carriers at the drain side. Drain side well doping may be reduced with almost no impact on the OFF current.

The ON current is provided in large part by drift of inversion charge. The density of the inversion charge is increased by a reduction in the well doping that causes a decline in the channel's resistance. The decline in the channel's resistance leads to a higher drive. The reduction of the drain-side well doping leads to a lower channel resistance and a higher ON current almost without making an impact on the OFF current. To obtain low OFF current the embodiment of the MOSFET of the present invention is implemented with high source-side doping and lower drain-side doping.

Figure 1:
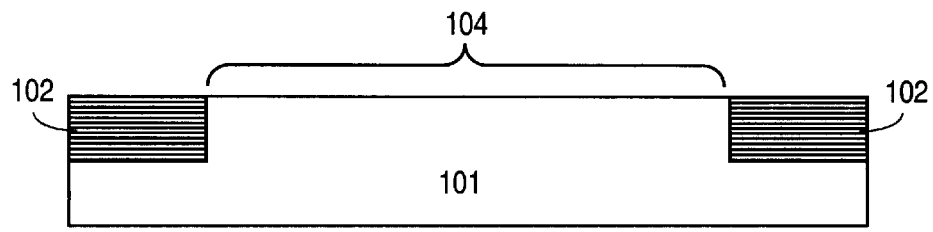
FIG. 1 illustrates a cross-sectional view through a semiconductor substrate with isolation trenches according to one embodiment of the present invention.

Fabrication of an asymmetric-well in a MOSFET device according to one embodiment of the process of the present invention, starts with a uniform low doped channel and goes on with addition of dopants. FIG. 1 illustrates a cross-sectional view through a semiconductor substrate 100 with isolation trenches 102 formed therein. Isolation trenches 102 define therebetween an active region 104. Fabrication of isolation trenches 102 is a process well-known in the art. Also, in one embodiment of the present invention, semiconductor substrate 100 is a p-type silicon substrate that includes well region 101. Also, in one embodiment of the present invention, the concentration of P-type impurities in the well region 101 may be in a range of $10^{16}$–$10^{17}$/cm$^3$, but the present invention is not limited in scope to this range.

Figure 2:
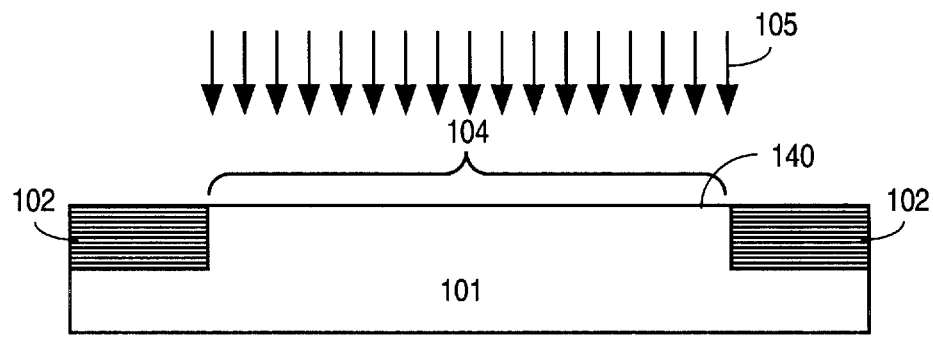
FIG. 2 illustrates a cross-sectional view through the semiconductor substrate into which impurities are implanted according to one embodiment of the present invention.

FIG. 2 illustrates a cross sectional view through the substrate 100 where p-type impurities 105 are implanted through the surface 140 of substrate 100 which may be a silicon substrate in one embodiment of the present invention. The p-type impurities are implanted approximately perpendicularly to top surface 140 to adjust the threshold voltage of the surface of the active region 104. The ion type of the p-type impurities may be boron for example, but the present invention is not limited in scope to this type of ion for the p-type impurities. Also, in one embodiment of the present invention, the acceleration energy of the boron is in an approximate range of 10–40 kiloelectron volt (KeV) and the doses are in an approximate range of approximately $10^{11}$–$10^{13}$ ions/cm$^2$.

Figure 3:
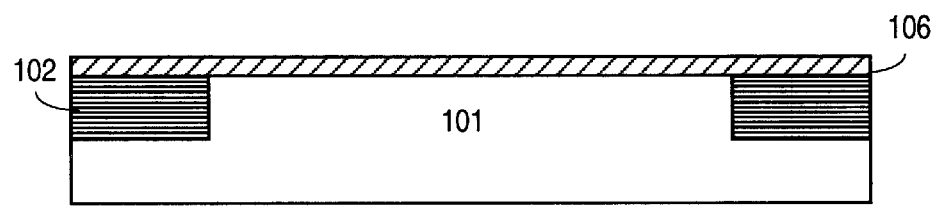
FIG. 3 illustrates a cross-sectional view through a semiconductor substrate with a gate-oxide insulation film formed on the surface of the semiconductor substrate according to one embodiment of the present invention.

A gate insulation film 106 is formed on the surface of substrate 101 as illustrated in FIG. 3. The gate insulation film 106 may be made of oxide. In one embodiment, the gate oxide insulation film 106 is formed by a process of thermal growth, which is well known in the art. The gate oxide insulation film 106 may have a thickness in an approximate range of 2 to 10 nanometers.

Figure 4:
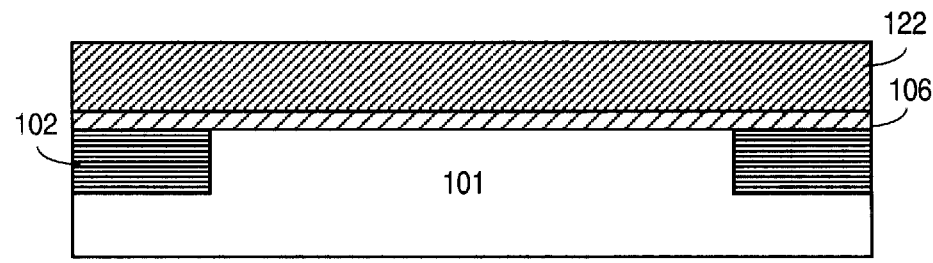
FIG. 4 illustrates a cross-sectional view through a semiconductor substrate with a polysilicon layer formed over the gate-oxide insulation film according to one embodiment of the present invention.

FIG. 4 illustrates a cross-sectional view through the structure of FIG. 3 after a layer 122 is formed over oxide oxide insulation film 106 by way of a well-known process of chemical vapor deposition (CVD). Layer 122 may be made of a material suitable for a gate electrode of the MOSFET transistor to be built. In the embodiment of the present invention described herein, layer 122 includes polysilicon. The polysilicon layer 122 is processed by way of a well-known photolithography process and etched by way of a well-known etching process to form a gate electrode 108 that has specified dimensions, as illustrated in FIG. 5.

Figure 5:
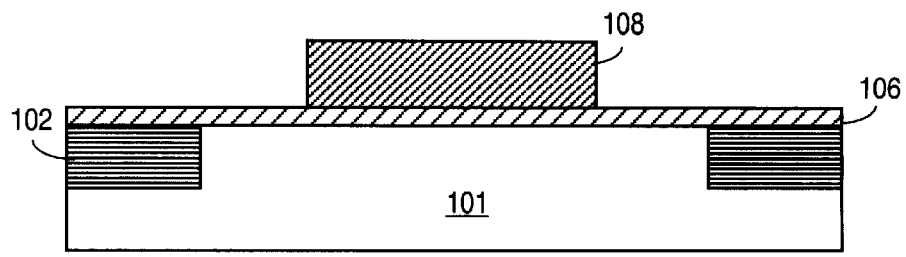
FIG. 5 illustrates a cross-sectional view through the semiconductor substrate with an etched gate according to one embodiment of the present invention.
Figure 6:
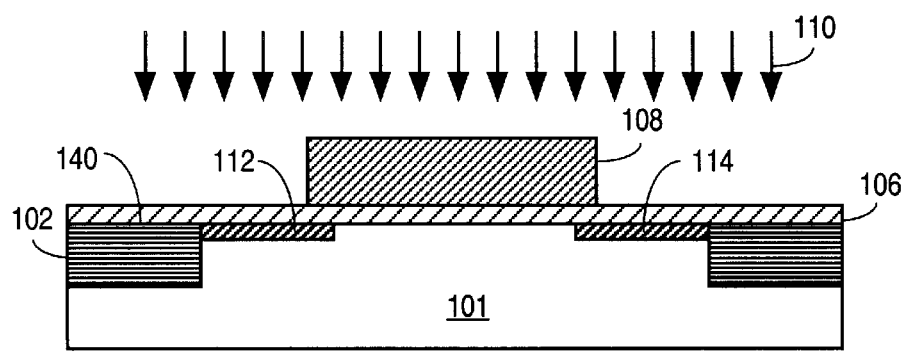
FIG. 6 illustrates a cross-sectional view through the structure of FIG. 5 into which ions are implanted according to one embodiment of the present invention.

FIG. 6 illustrates a cross-sectional view through the structure of FIG. 5 where ions of a n-type impurity are implanted through the surface 140 of the substrate 100, approximately perpendicularly to this surface 140, with gate electrode 108 used as a mask. In one embodiment of the present invention, the ions of the n-type impurity may be arsenic for instance, the acceleration energy may be in an approximate range of 1–10 KeV, and the dose of the ions may be in a range of approximately $10^{14}$–$10^{15}$ ions/cm$^2$. The implanted n-type impurities form n-type lightly doped extension regions (tips) 112 and 114 which are part of the source and drain regions respectively.

Figure 7:
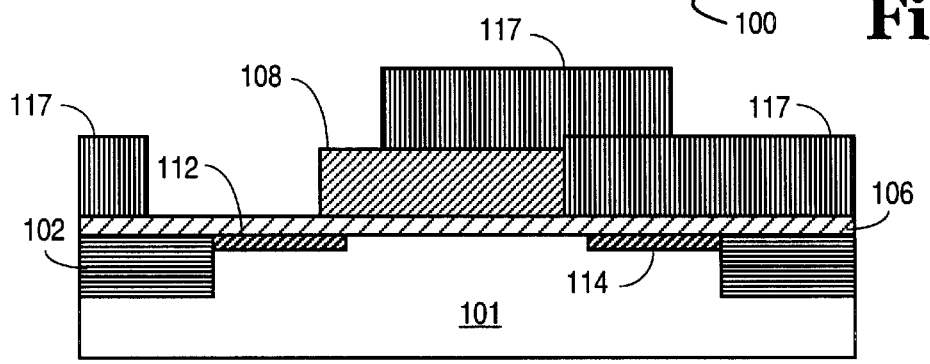
FIG. 7 illustrates a cross-sectional view through the structure of FIG. 6 with a blocking mask placed thereon.

Next, as shown in FIG. 7, a blocking mask 117 is formed on top of gate 108 and on top of a portion of the gate oxide insulation film 106 that overlies the drain region. The mask 117 may be made of a photosensitive material. Mask 117 covers the drain-side region to prevent ions from being implanted therein, but allows ions to be implanted into the source region thereby leading to the formation of an asymmetrically doped well. This mask leaves the source-side region exposed when a tilted angle asymmetric rotational ion implantation is performed as illustrated in FIG. 8.

Figure 8:
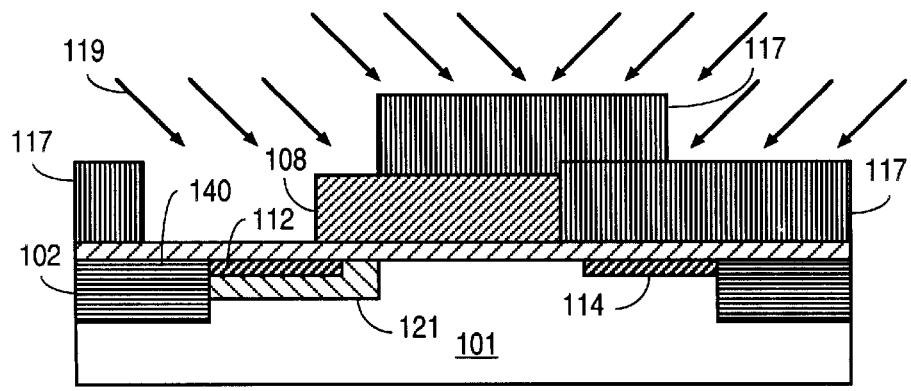
FIG. 8 illustrates a cross-sectional view through the structure of FIG. 7 subjected to a rotational tilted angle implantation according to one embodiment of the present invention.

Next, in a manner as shown in FIG. 8, ions of P-type impurities 119 are implanted through the surface of silicon substrate 100 at a tilted angle (tilted-angle rotational ion implantation) with respect to top surface 140. The tilted-angle rotational ion implantation, also known as HALO implantation, is a method well known in the art. Mask 117 is used to block regions other than the source region of the MOSFET to be fabricated. The angle of implantation may be set in a range of approximately 15 to 45 degrees with respect to a line (not shown) normal to the surface 140 of substrate 100 but the present invention is not limited in scope to this range. The substrate 100 is then rotated at specified angles around the normal to surface 140. In one embodiment of the present invention, the P-type impurity ions include boron, the acceleration energy of the impurities may be in a range of approximately 30 to 100 KeV, and the dose of impurities may be in a range of approximately $10^{12}$ to $10^{13}$ ion/cm$^2$. The implanted P-type impurities form an un-even highly doped junction region 121 that extends about ⅓ the width of gate electrode 108 below gate electrode 108. Region 121 also extends below tip 112. Note that the process of forming the heavily doped region 121 may be performed before forming the tip 112.

Figure 9:
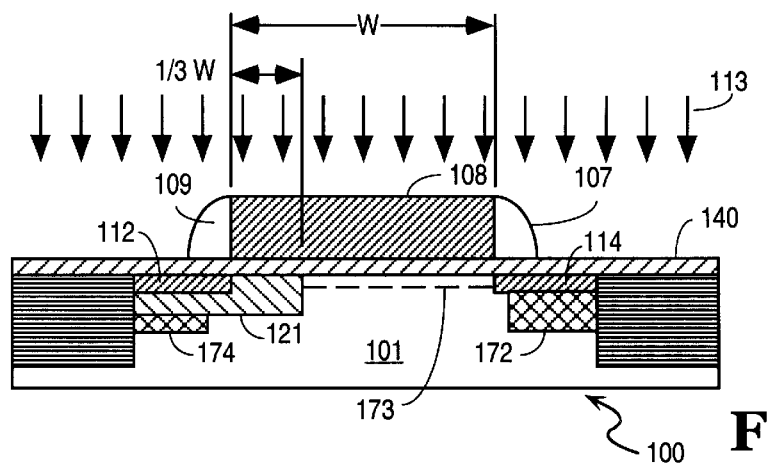
FIG. 9 illustrates a cross-sectional view through the structure of FIG. 8 where this structure is subjected to a process of impurity implantation according to one embodiment of the present invention.

Next, in a manner as illustrated in FIG. 9, sidewalls 107, 109, made of SiO$_2$, for example, are formed on both sides of gate electrode 108 by a technique well known in the art. The gate electrode 108 and the sidewalls 107 and 109 are used as a mask. Then, impurities (ions of n-type) 113 are implanted into portions of the well, on both sides of the sidewalls 107 and 109, approximately perpendicularly to the surface 140 of the substrate. This process is a deep source-drain implantation as the implanted n-type impurities form the n-type heavily doped regions 174 and 172 respectively outside the n-type lightly doped extension implant regions 112 and 114, respectively. In one embodiment of the present invention, the ion chosen for the n-type impurities may be arsenic, for example, the acceleration energy may be 30–50 KeV and the dose may be in a range of approximately $10^{14}$–$10^{16}$ ion/cm$^2$. The n-type lightly doped extension region 112 and the n-type heavily doped regions 121 and 174, at the left end of the channel 175, form the source region. The n-type lightly doped extension region 114 and the n-type heavily doped region 172, at the right end of channel 173, form the drain region. In principle, the channel forms under certain bias conditions. Therefore, the structure demarcated by dotted line 173 and the bottom surface of gate oxide 140 is a best representation of the channel. In one embodiment, the channel has a length in a range of approximately 0.02–0.15 micrometers.

Next, the structure of FIG. 9 is subjected to an activation and diffusion process. Typically, ions are bunched together and are not electrically active when implanted. To diffuse the ions and electrically activate them at some point during the process, the substrate with the ions implanted therein is annealed at a temperature in a range of 900° C. to 1100° C. for a time in an approximate range of 60 seconds to 10 minutes. The annealing process "activates" the dopants allowing them to provide electrons or holes that may participate in the conduction process. At the end of this process, the structure shown in FIG. 10 is obtained.

Figure 10:
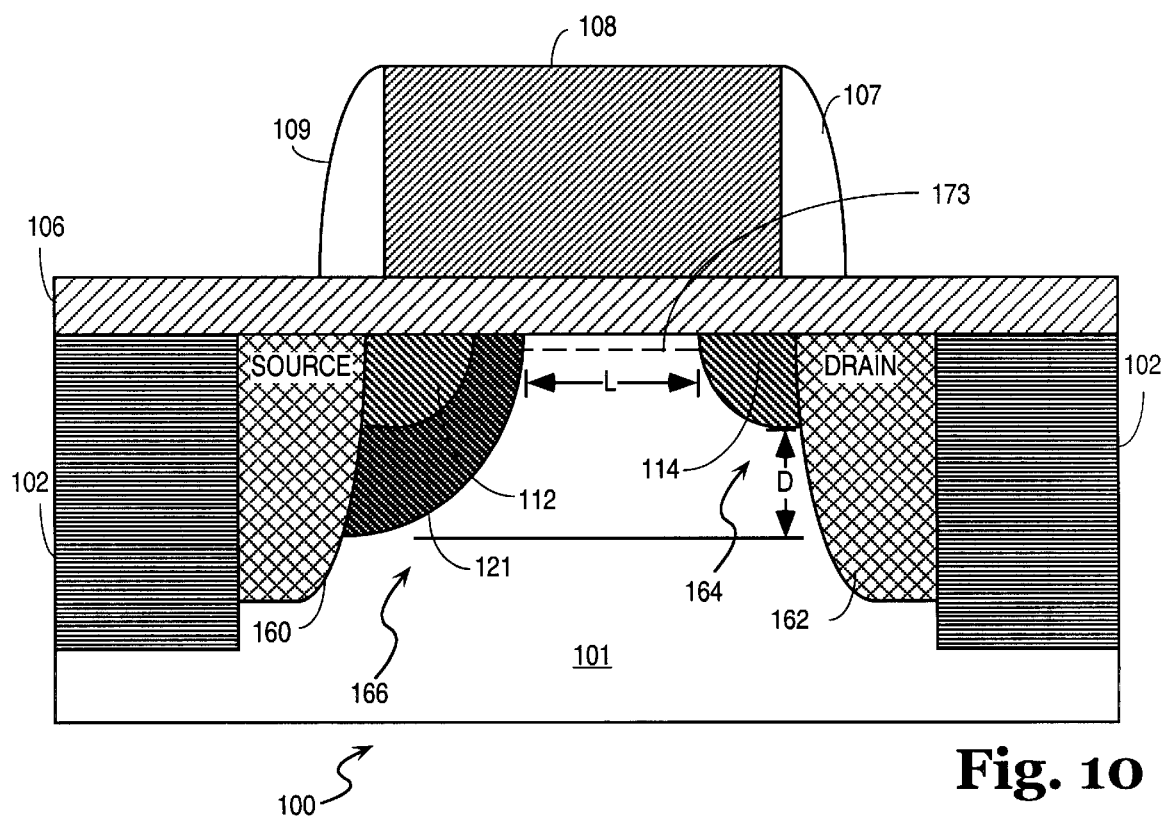
FIG. 10 illustrates a cross-sectional view through a fabricated Metal Oxide Semiconductor Field Effect Transistor (MOSFET) according to one embodiment of a process of the present invention.

FIG. 10 illustrates a cross sectional view through a MOSFET 100 made according to one embodiment of the process of the present invention described above. MOSFET 100 includes polysilicon gate 108, sidewall spacers 107 and 109 formed on both sides of gate 108, and gate oxide insulation layer 106 on which gate 108 is formed. Transistor 100 further includes source 160 and drain 162 regions that have substantially the same doping concentration. Furthermore, transistor 101 includes source and drain extension regions 112 and 114, respectively, that have substantially the same doping concentration.

The well 101 includes a first region 164, near the drain region 162, that includes drain extension 114. Well 101 also includes a second region 166, near the source region 160, that includes the source extension 112 and region 121 created by way of the tilted angle rotational implantation described above. In one embodiment, the well is doped at an ion concentration in a range of $10^{16}$–$10^{17}$ ions/cm$^3$. The first region is doped in a range of approximately $10^{17}$–$10^{18}$ ion/cm$^3$, while the second region is doped in a range of approximately $10^{18}$–$10^{19}$ ions/cm$^3$. The drain side well doping in the first region 1164 is low to reduce the channel's resistance. The second region 166 is doped higher than the first region 1164, to provide a higher potential energy barrier at the source-side thereby reducing the diffusion limited OFF current (leakage current). This barrier may be best characterized as a PN junction barrier to minority carrier injection into the channel region when the device is off. The potential energy barrier prevents minority carriers, i.e. electrons/holes from going to the source/drain regions respectively. In one embodiment a difference between a depth of the first and second regions is in a range of approximately 0.02 to 0.4 micrometers. The asymmetric-well MOSFET device 100 may also be produced by selectively growing doped epitaxial regions at the two ends of the channel without having to perform asymmetrical tilted angle rotational implantation.

Figure 11:
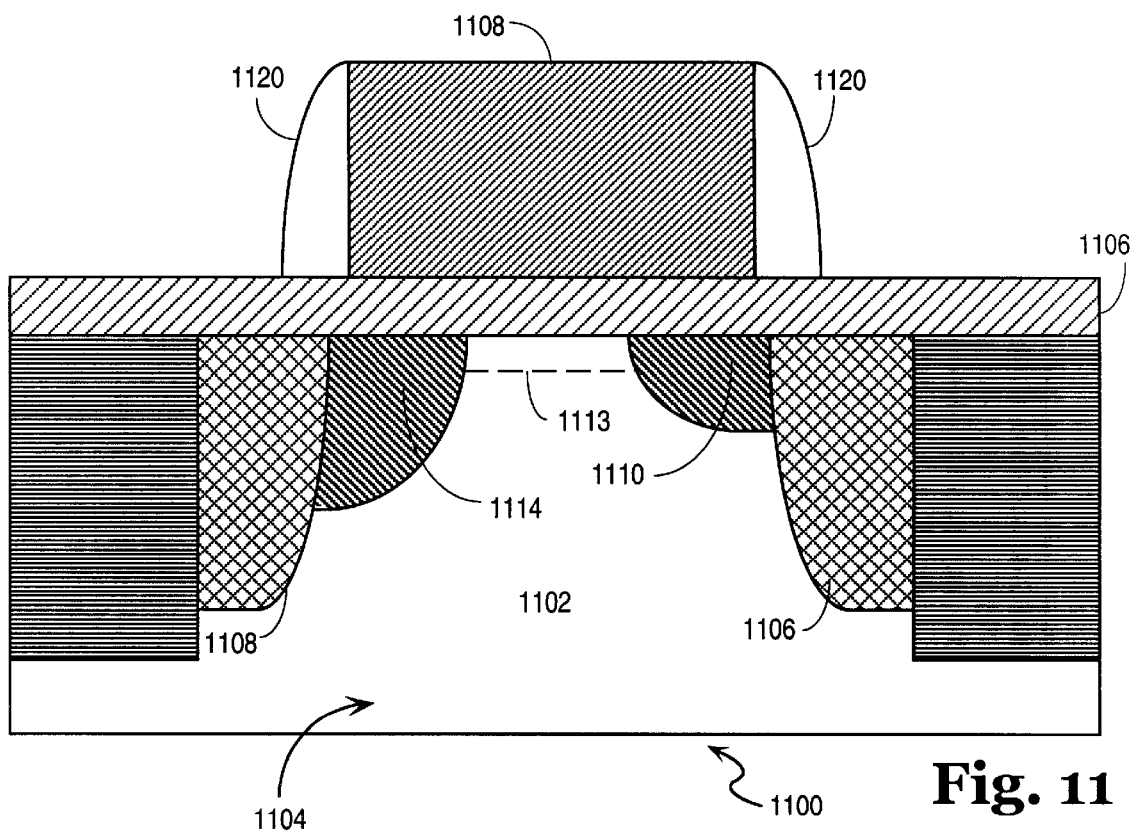
FIG. 11 illustrates a cross-sectional view through a MOSFET transistor according to a second embodiment of the present invention.

In a second embodiment of the present invention, a MOSFET 1100 as illustrated in FIG. 11 is provided. Transistor 1100 has a well region 1102, of a first conductivity type, formed in substrate 1104. Transistor 1100 also has a source region 1108 and a drain region 1106 of a second conductivity type. The source and drain regions 1108 and 1106, respectively, are spaced apart from each other in the well 1102. Transistor 1100 further includes a drain extension 1110, of the second conductivity type, formed in well 1102 in the vicinity of drain region 1106. Transistor 1100 also has a source extension 1114, of the second conductivity type, formed in the vicinity of the source region 1108. The source extension 1114 is doped more heavily than the drain extension 1110. Also, the source extension 1108 extends deeper into the well 1102 than the drain extension 1110.

The asymmetric dopings of the extensions near the source and drain regions increase the performance of MOSFET 1100. The source extension 1114, which is highly doped, forms a deep junction with an abrupt lateral profile to reduce series resistance of the channel 1113. The drain extension is shallow and has a lateral abruptness lower than the lateral abruptness of the source extension to reduce short channel effects.

The series resistance in MOSFETs and in particular in MOSFET 1100 is attributed mainly to the spreading of current from the channel into the source extension region. By allowing the source extension region to be deeper, the cross sectional area for current flow is increased and thus the resistance is reduced. De-biasing is important mostly at the source-side as it determines the gate-channel bias. Most of transistor's de-biasing occurs during the transport of carriers through the source extension region. A deeper extension on the drain side may not reduce effective de-biasing, but may degrade the short-channel performance.

Figure 12:
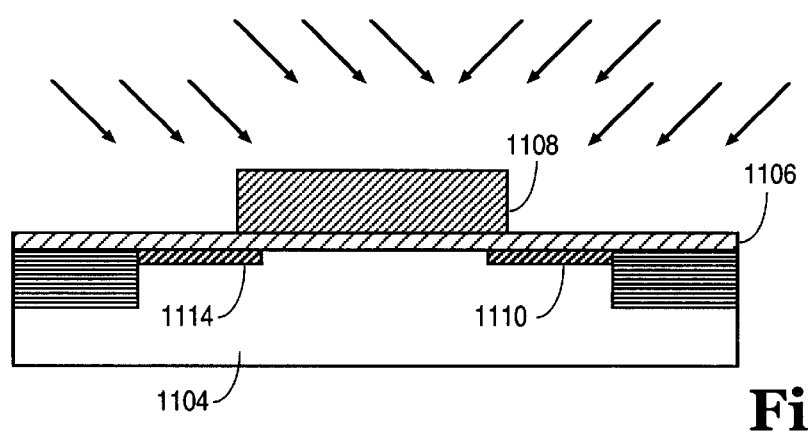
FIG. 12 illustrates the structure of FIG. 6 subjected to a tilted angle implantation process.

Transistor 1100 is made by way of a second embodiment of a process according to the present invention that is explained in the following description. The second embodiment of the process according to the present invention utilizes the initial processing stages described in connection with FIGS. 1–6. In this respect, the description in connection with FIGS. 1–6 is herein incorporated by reference. After the source and drain extensions are obtained by the steps described in connection with FIGS. 1–6, tilted angle rotational implantation is performed as shown in FIG. 12. In one embodiment, the tilted angle rotational implantation is a symmetric process, i.e., the tilted ions are implanted both in the source region and in the drain region of the substrate.

Figure 13:
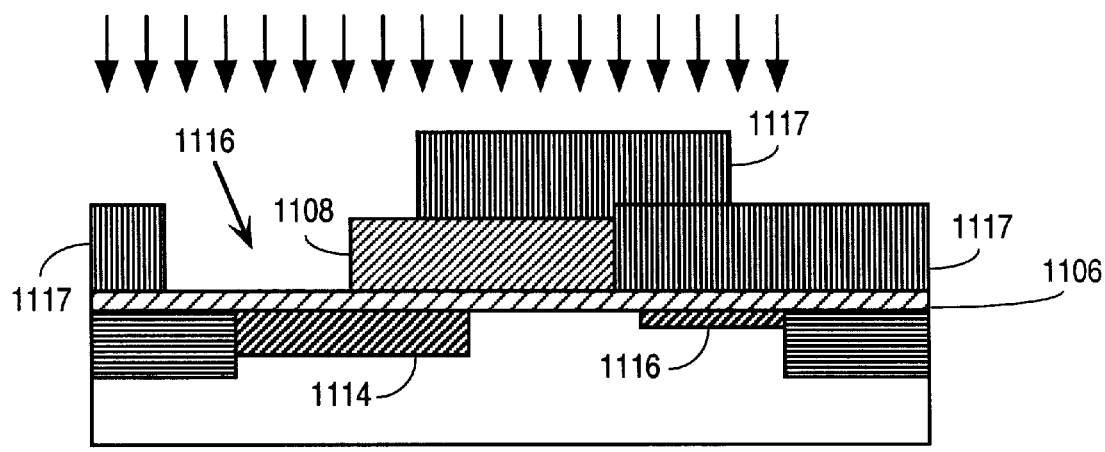
FIG. 13 illustrates a cross-sectional view through the structure of FIG. 12 where part of the structure's surface is covered with a blocking mask and the structure is implanted with ions.

The surface of gate oxide insulation film 1106 is covered with a photosensitive material such as a photoresist which is then patterned to open on top of the source region of the MOSFET device as shown in FIG. 13. The areas overlaying the drain region and the gate are covered by mask 1117. The structure of FIG. 13 is then subjected to ion implantation to cause an increase in the source extension 1114. The ion implantation of the source region is performed to form a highly doped source extension which reduces the series resistance. The highly doped source extension is obtained by augmenting the dose of symmetric low doped source extension formed during the step described in connection with FIG. 6. The implant may be done at zero degrees angle relative to the normal to gate oxide insulation film 1106 or at any other tilt angle established by device design. The implant dose and energy depends upon species (Arsenic, Phosphorus, or Boron) and device architecture. The regular process then follows including forming spacers, deeply implanting the source and drain regions and then diffusing and activating the implants to obtain the MOSFET of FIG. 11. The final device's performance is improved due to reduced source side series resistance obtained as a result of the highly doped deep extension region at the source side. The performance is also improved by maintaining good short channel effects using a shallow drain side extension region.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited by the appended claims.

What is claimed is:

1. A method to form a Field Effect Transistor comprising:
   forming a well of a first conductivity type in a substrate; and
   forming a drain region, a source region, a first region, and a second region, each of a second conductivity type, in the well, wherein
   the first region is formed between the drain region and a centerline at a location that is adjacent to the drain region at a first distance from the centerline,
   the second region is formed with tilted-angle rotational ion implantation adjacent to the source region at the first distance from the centerline and disposed apart from the first region, and wherein:

(i) the first region defines a first dopant concentration and the second region defines a second dopant concentration that is greater than the first dopant concentration;

(ii) the second region is asymmetrical to the first region about the centerline; and (iii) the substrate defines a top surface, wherein the first region defines a bottom and the second region defines a bottom that is located from the top surface at a depth that is greater than a distance between the top surface and the bottom surface of the first region.

2. The method claim 1, wherein the second region defines a source extension region having a source extension region dopant concentration and a junction region having a junction region dopant concentration, wherein the junction region dopant concentration is different from the source extension region dopant concentration.

3. The method claim 2, wherein the source extension region dopant concentration is less than the junction region concentration.

4. The method claim 1, wherein the source region and the drain region each define a third dopant concentration, and wherein the second dopant concentration is less than the third dopant concentration.

5. The method claim 1, wherein the second region is disposed apart from the first region by a length in a range of approximately 0.02 to 0.15 micrometers.

6. The method claim 1, wherein a difference between the depth of the first region and the second region is in a range of approximately 0.02 to 0.4 micrometers.

7. A method to form a Metal Oxide Semiconductor Field Effect Transistor (MOSFET) comprising:

forming a well of a first conductivity type in a substrate;

forming, in the well apart from each other, a source region and a drain region, each of a second conductivity type;

forming, in the well near the drain region, a first region of the second conductivity type and having a first dopant concentration; and forming, in the well near the source region, with tilted-angle rotational ion implantation, a second region of the second conductivity type and having a second dopant concentration, wherein the second dopant concentration is substantially higher than the first dopant concentration.

8. The method of claim 7 wherein forming the well includes forming a well of an ion concentration in a range of approximately $10^{16}$–$10^{17}$ ions/cm$^3$.

9. The method of claim 7 wherein forming the first region includes forming a first region having an ion concentration in a range of approximately $10^{17}$–$10^{18}$ ions/cm$^3$.

10. The method of claim 7 wherein forming the second region includes forming a second region having an ion concentration in a range of approximately $10^{18}$–$10^{19}$ ions/cm$^3$.

11. The method of claim 7 wherein forming the source and the drain regions include forming a source and a drain region each having a ion concentration in a range of approximately $10^{20}$–$10^{21}$ ions/cm$^3$.

12. The method of claim 7 wherein forming the source region further includes forming a lightly doped source extension as part of the source region.

13. The method of claim 7 wherein forming the drain region further includes forming a lightly doped drain extension as part of the drain region.

14. The method of claim 7 further comprising:

defining a channel region between the source region and the drain region.

15. The method of claim 14 further comprising:

forming a gate overlying the channel region.

16. The method of claim 7 wherein the first region includes a dopant concentration that is greater than a dopant concentration of the well.

17. The method of claim 7 wherein the channel defines length in a range of approximately 0.02–0.15 micrometers.

18. The method of claim 7 wherein a difference between a depth of the first region and of the second region is in a range of approximately 0.02 to 0.4 micrometers.

* * * * *